United States Patent
Gorti et al.

(10) Patent No.: US 9,903,913 B2
(45) Date of Patent: Feb. 27, 2018

(54) SCAN OR JTAG CONTROLLABLE CAPTURE CLOCK GENERATION

(71) Applicant: Advanced Micro Devices, Inc., Sunnyvale, CA (US)

(72) Inventors: Atchyuth Gorti, Austin, TX (US); Anirudh Kadiyala, Austin, TX (US); Bill K. C. Kwan, Austin, TX (US); Venkat Kuchipudi, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 214 days.

(21) Appl. No.: 14/159,247

(22) Filed: Jan. 20, 2014

(65) Prior Publication Data

US 2014/0359386 A1    Dec. 4, 2014

Related U.S. Application Data

(62) Division of application No. 12/879,993, filed on Sep. 10, 2010, now Pat. No. 8,633,725.

(51) Int. Cl.
*G01R 31/02* (2006.01)
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31727* (2013.01); *G01R 31/318552* (2013.01); *G01R 31/318555* (2013.01); *Y10T 29/41* (2015.01)

(58) Field of Classification Search
CPC .......... G01R 31/318555; G01R 31/275; G01R 31/2879; G01R 31/318533; G01R 31/318572; G01R 31/31858; G01R 31/318536; G01R 31/318544; G01R 31/3177; G01R 31/3183; G01R 31/318552; G01R 31/31715
See application file for complete search history.

(56) References Cited

U.S. PATENT DOCUMENTS

| | | | | |
|---|---|---|---|---|
| 5,341,096 A | * | 8/1994 | Yamamura | ....... G01B 31/31855 324/73.1 |
| 2002/0125907 A1 | * | 9/2002 | Kurtulik | ............ G01R 31/3185 324/750.3 |
| 2004/0163021 A1 | * | 8/2004 | Nadeau-Dostie | ......................... G01R 31/31858 714/726 |

* cited by examiner

*Primary Examiner* — Tung X Nguyen

(57) ABSTRACT

A capture clock generation control mechanism is provided. The capture clock generation control mechanism controls the number of at-speed clocks generated and supplied to one or more scan chains during scan testing of a microcircuit based on control data stored in a JTAG or scan test register. The scan test register may be formed out of scan cells and comprise part of a scan chain. Automatic Test Pattern Generation (ATPG) tools may generate the data that is loaded into the scan test register to automatically configure the clock generation control mechanism. The clock control mechanism may include the ability to adjust the position of the at-speed clocks within a capture cycle, thereby facilitating transition fault detection.

13 Claims, 4 Drawing Sheets

SCAN OR JTAG CONTROLLABLE CAPTURE CLOCK GENERATION

CROSS-REFERENCE TO RELATED APPLICATION

The present application is a divisional of prior co-pending U.S. patent application Ser. No. 12/879,993, filed Sep. 10, 2010.

BACKGROUND OF THE INVENTION

1. Field of the Invention

Generally, the present disclosure relates to integrated circuits, and, more particularly, to the generation and control of capture clocks used during scan and built-in self-testing of integrated circuits.

2. Description of the Related Art

Design-for-Testability (DFT) is a technique that enhances a microcircuit's testability by incorporating certain features into the microcircuit's design to facilitate testing of the manufactured product. The goal of such a design is to make difficult-to-test sequential circuits easier to test by replacing traditional sequential elements, such as flip flops (hereinafter called flops) with scannable sequential elements, called scan cells, and then connecting the scan cells together to form scan chains. A scan cell is a normal latch or flip-flop with an additional input, called the scan input, and an additional output, called the scan output. The scan output of one scan cell connects to the scan input of the next scan cell to form the scan chain. The scan cells connect to the core logic and become part of the core design. With the added inputs and outputs that form the scan chains, you can shift data serially into and out of the core logic to inject test patterns into, or receive test results from, a manufactured microcircuit design.

Each scan cell of the scan chain serves as both a control and an observation point for Automatic Test Pattern Generation (ATPG) testing and fault simulation. ATPG tools automatically generate test patterns for use in the scan chains. Automatic Test Equipment (ATE) shifts these test patterns into the scan chains and supplies, or causes to be supplied, one or more clock pulses to the core logic. The responses to the test patterns are captured within the scan cells and the results are shifted out of the scan chain. ATE then compares the results with expected results to determine if a fault is present.

Many test patterns are typically generated and used during scan testing. Different test patterns provide different test coverage. A pattern having high test coverage typically tests many different parts of the design while a pattern having low test coverage tests only smaller portions. To meet a test budget, it is desirable to move test patterns with high test coverage to the beginning of a pattern set and test patterns with low test coverage to the end of the pattern set or drop them altogether.

Because each test pattern usually requires a different number of at-speed clock pulses to be applied to the scan chain, test patterns are typically ordered by the number of at-speed clock pulses each requires. Ordering test patterns by the required number of clock pulses reduces the number of times the clock circuitry must be adjusted during test. A typical scan test cycle includes shifting a scan test pattern into the scan chain, pulsing a system clock one or more times to capture test results within the scan chain, and shifting the results out. A capture cycle is that portion of the scan test that captures the test results.

Boundary-Scan Testing, also known as the Joint Test Action Group (JTAG) standard, or IEEE 1149.1, is another test architecture known in the art. Among other things, it provides a means for testing integrated circuits within the core logic by, for example, initiating logic built-in self-test (LBIST), without using physical test probes. JTAG architecture adds boundary-scan cells to each pin on a microcircuit device and to core logic so that test and control data can be injected into the logic, tests can be initiated, and the results shifted out, even when the microcircuit is encased in a package. JTAG registers and control circuitry interact with other circuitry within a microcircuit device to initiate and control internal testing.

SUMMARY OF EMBODIMENTS OF THE INVENTION

The apparatuses, systems, and methods in accordance with the embodiments of the present invention facilitate scan and LBIST testing by providing programmable clock control mechanisms within a microcircuit design that determine the number and locations of at-speed capture clocks supplied to scan cells during a scan test. Control mechanisms include a capture clock generation circuit for generating the required number of clock pulses, including programmable delays within a capture cycle of a scan test, and control registers, such as a JTAG register or a scan register, that contain the control information for configuring the capture clock generation circuit. These control mechanisms may be formed within a microcircuit by any means, such as by growing or deposition.

One apparatus in accordance with the embodiments of the present invention includes a register that is formed on a semiconductor material and configured to receive control data from a test interface for testing the microcircuit design. The register is coupled to a clock control circuit that is also formed on the semiconductor material. The clock control circuit is configured to produce a number of clock pulses for capturing test data within a scan chain based on the control data contained in the register. The clock control circuit may further include additional circuitry to adjust the location of the clock pulses within a capture cycle of a scan test. The register may be a scan test register comprised of scan cells configured as part of the scan chain, or a JTAG register, and the data scanned into the scan chain may comprise a test pattern that includes the control data to be scanned into the register.

One method in accordance with the embodiments of the present invention comprises forming a register on a semiconductor material that is configured to store control data, and forming a capture clock generation circuit on the semiconductor material that is coupled to the register and configured to supply a number of clock pulses to a scan chain based on the information stored in the register. The register may be a stand-alone register, a scan test register that is part of the scan test chain, or a JTAG register, and the data scanned into the scan chain may comprise a test pattern that includes the control data to be scanned into the scan test register.

Another method in accordance with the embodiments of the present invention includes providing control data to a register coupled to a clock control circuit, wherein the control data indicates the required number of test pulses to be supplied to a scan chain during the capture cycle of a scan test and the clock control circuit is configured to be responsive to the control data for supplying the required number of test pulses to the scan chain. The method further includes shifting a test pattern into the scan chain. The scan chain, register, and clock control circuit are all formed on the same semiconductor material. The register may be a JTAG register, a stand-alone test register, or a scan test register configured as part of the scan chain, or its own scan chain. The clock control circuit may include additional control circuitry to position the clock pulses at programmable locations within the capture cycle.

The invention described herein may be used in any type of integrated circuit that utilizes DFT or boundary-scan testing techniques for testing. One example is a general purpose microprocessor. A general purpose microprocessor typically performs basic arithmetic operations, moves data from one memory location to another, and makes decisions based on the quantity of certain values contained in registers or memory. To perform these activities, a microprocessor typically incorporates a number of execution units, such as a floating point unit or an integer execution unit, and control units. The control and execution units may be designed, for example, using scannable sequential elements configured into one or more scan chains. During testing of the device, test patterns can be generated and shifted into the control and execution units. A clock control unit coupled to the scannable sequential elements and to a scan-test register or a JTAG register can provide the control and clocking necessary to capture the test results. Once captured, the test results may be shifted out by conventional means.

BRIEF DESCRIPTION OF THE FIGURES

The disclosed subject matter will hereafter be described with reference to the accompanying drawings, wherein like reference numerals denote like elements, and.

Figure 1:
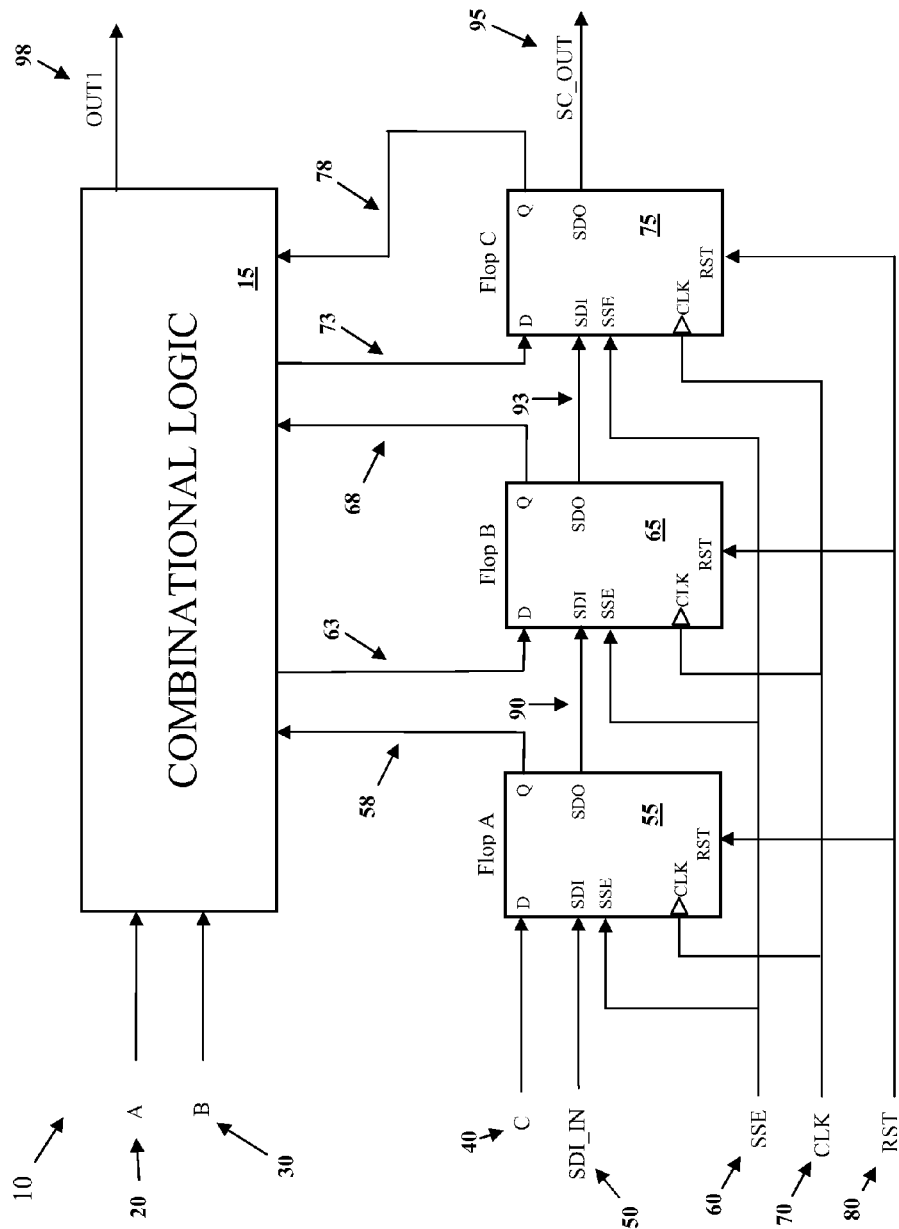
FIG. 1 is a simplified schematic diagram of an exemplary microcircuit design utilizing scannable sequential elements in the form of mux-d flops typically found in the prior art.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

FIG. 1 is a simplified schematic diagram of an exemplary microcircuit design utilizing scannable sequential elements in the form of mux-d flops of the kind typically found in the prior art. The microcircuit receives seven inputs, A 20, B 30, C 40, SDI_IN 50, SSE 60, CLK 70, and RST 80, and sources two outputs, OUT1 98 and SC_OUT 95. Inputs A 20, B 30, and C 40 are supplied to the functional logic 15 for processing, and the results are clocked into flops 55, 65, and 75 with the rising edge of CLK 70. The scannable elements 55, 65, and 75 each comprise a scan cell, having, in addition to the D input and Q output of a normal flop, one scan input (50, 90, and 93, respectively) and one scan output (90, 93, and 95, respectively). The scan output of one cell connects to the scan input of the next cell, forming a scan chain. The scan enable signal (SSE 60) supplied to each cell determines whether the input to the cell is received from the cell's D input signal or from the scan input signal, with a logic high selecting the scan input signal. When the CLK 70 is pulsed, the Q (58, 68, and 78) and SDO (90, 93, and 95) outputs of each cell, respectively, latch to the logic value of their corresponding D or scan input lines, depending on the state of scan enable signal.

Such a configuration facilitates testing of the microcircuit. When the combinational logic 15 is large and complex, such as in a microprocessor design, it is desirable to have many scan cells serially connected in the manner described in FIG. 1 to form one or more scan chains. Test patterns can then be serially shifted into the scan chains via the scan input pin of the first scan cell (e.g., SDI_IN 50) by activating the scan enable signal SSE 60 and cycling CLK 70. Once the pattern has been injected into the scan chain, the functional logic can be tested by deactivating the scan enable signal and pulsing the system clock (CLK 70) the desired number of times for the scan test. The results are captured in scan cells 55, 65, and 75 and can be shifted out of the scan chain through SC_OUT 95 in the same manner that the test pattern was shifted in.

Figure 2:
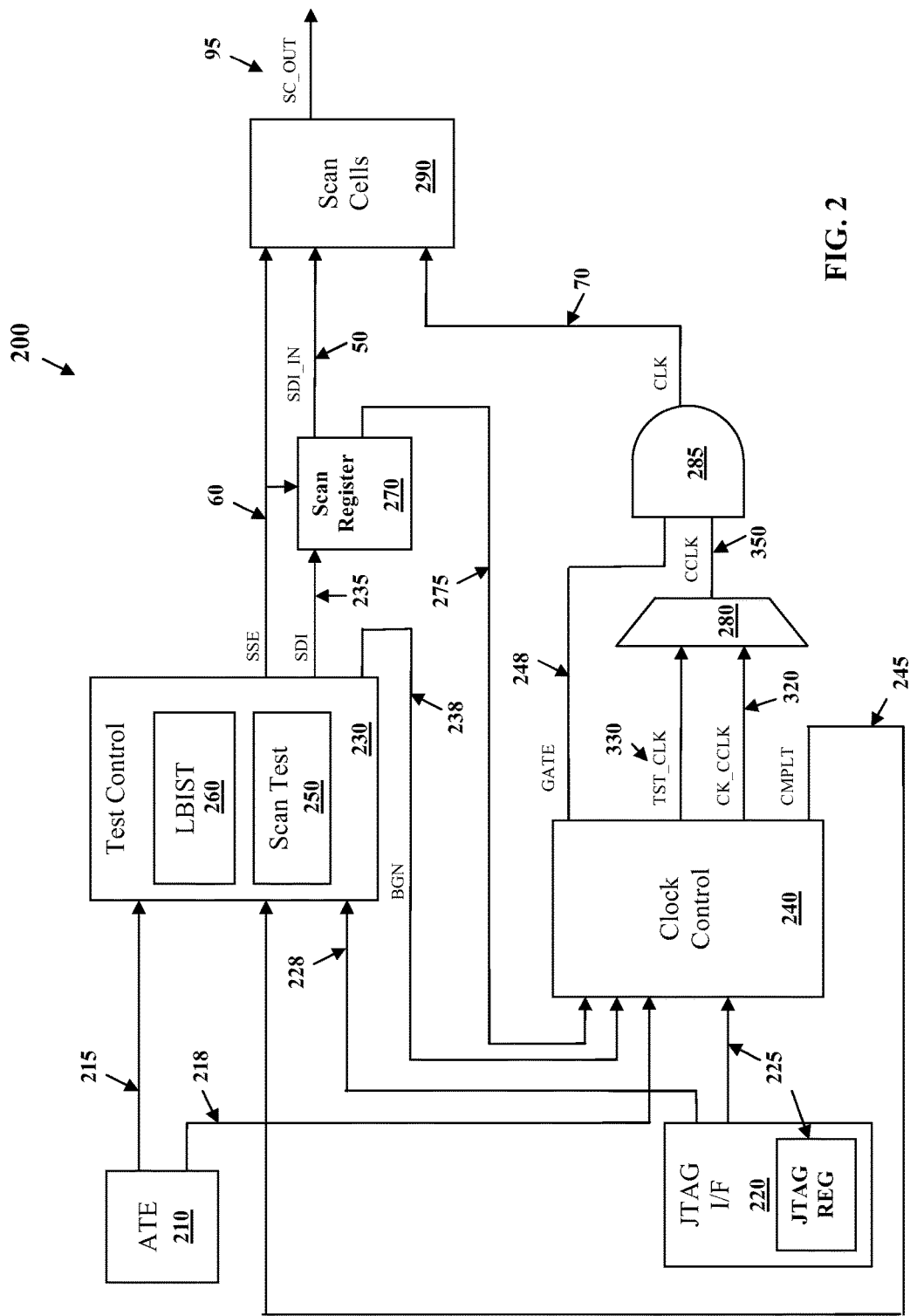
FIG. 2 is a block diagram of a microcircuit design in accordance with an embodiment of the invention.

FIG. 2 is a block diagram of an exemplary embodiment of the invention. Scan chain 290 of the type shown in FIG. 1 connects to test block 230, scan register 270, and clock gate 285. In this embodiment, the scan register comprises one or more scan cells and is configured as part of the scan chain 290, though it does not necessary have to be a part of the scan chain. In other embodiments, it may be a stand-alone register or a scan test register comprising its own scan chain or part of another scan chain. In the indicated embodiment, scan register 270 receives SDI signal 235 from test control 230, which becomes SDI_IN 50 (FIG. 1) on the other side of the chain. The shift scan enable signal (SSE) 60 connects to both the scan register 270 and the scan chain 290 to control the shifting in of a test pattern into the scan chain 290. SSE 60 and SDI 235 are under the control of test control 230.

Test control 230 contains two logic blocks, LBIST 260 and scan test 250. Each logic block may be the source of the SSE 60 and the SDI 235 signals. LBIST 260, for example, may be activated through JTAG interface 220 and provide a test pattern to the scan cells in the scan chain 290. In this mode, scan register 270 may be bypassed or not connected as part of the scan chain, and the test pattern may be directly shifted into the scan chain 290. JTAG interface 220 may contain a JTAG register 225 that provides control data to clock control circuit 240 to control and adjust the clocks supplied to the scan chain 290 during scan testing in the manner described in more detail below. To generate a test pattern, LBIST 260 may contain a random data generator, the output of which is shifted into the scan chain 290 for test.

Scan test block 250 receives test pattern data and controls 215 from external ATE 210. Scan test block 250 controls the shifting of the test pattern into the scan register 270 and the scan chain 290 by selecting the clock used to shift the test patterns into the scan cells 290 via handshake signals 238 to clock control 240 and by toggling SSE 60. The signals sourced by test control 230 may be synchronized to the system clocks which are also supplied to clock control 240 (not shown) or may receive its clocks from clock control

240. Clock control 240 may receive a system clock externally or may generate the system clock.

As indicated above, scan register 270 does not necessarily have to be a part of the scan chain 290, but can be a stand-alone register that is loaded with control information from ATE 210. In this configuration, SDI 235 connects directly to SDI_IN 50 and is supplied to scan cells 290, as shown in FIG. 1, and the output 275 of scan register 270 connects directly to clock control 240 to provide control information for generating the capture clocks for the scan tests.

CLK 70 is gated version of CCLK 350. The source of CCLK 350 is a test clock 330 for shifting in the scan patterns into the scan chain 290 or a gated version of system clock CK_CCLK 320 for providing the required number of at-speed clock pulses to the scan chain 290 during a capture cycle. The selection of the clock is shown functionally by multiplexer 280 and the gated version of the system clock 320 is shown functionally by the use of a gate signal 248 applied to gate 285. The gate is used to select the number and location of at-speed clocks supplied to the scan cells 290 within a capture test cycle, as described below. The number and positions of the at-speed clock pulses within a capture cycle are determined by clock control 240 based on the values contained in the scan register 270 or the JTAG register 225 and are initiated by a capture clock trigger signal 238 from test control 230. The timing and order of selection of the clocks is discussed in more detail below. Once clock control 240 supplies the required number of at-speed clock pulses to the scan chain 290, clock control 240 sources a complete signal 245 to test control 230 to notify it that the required number of capture pulses have been supplied.

Figure 3:
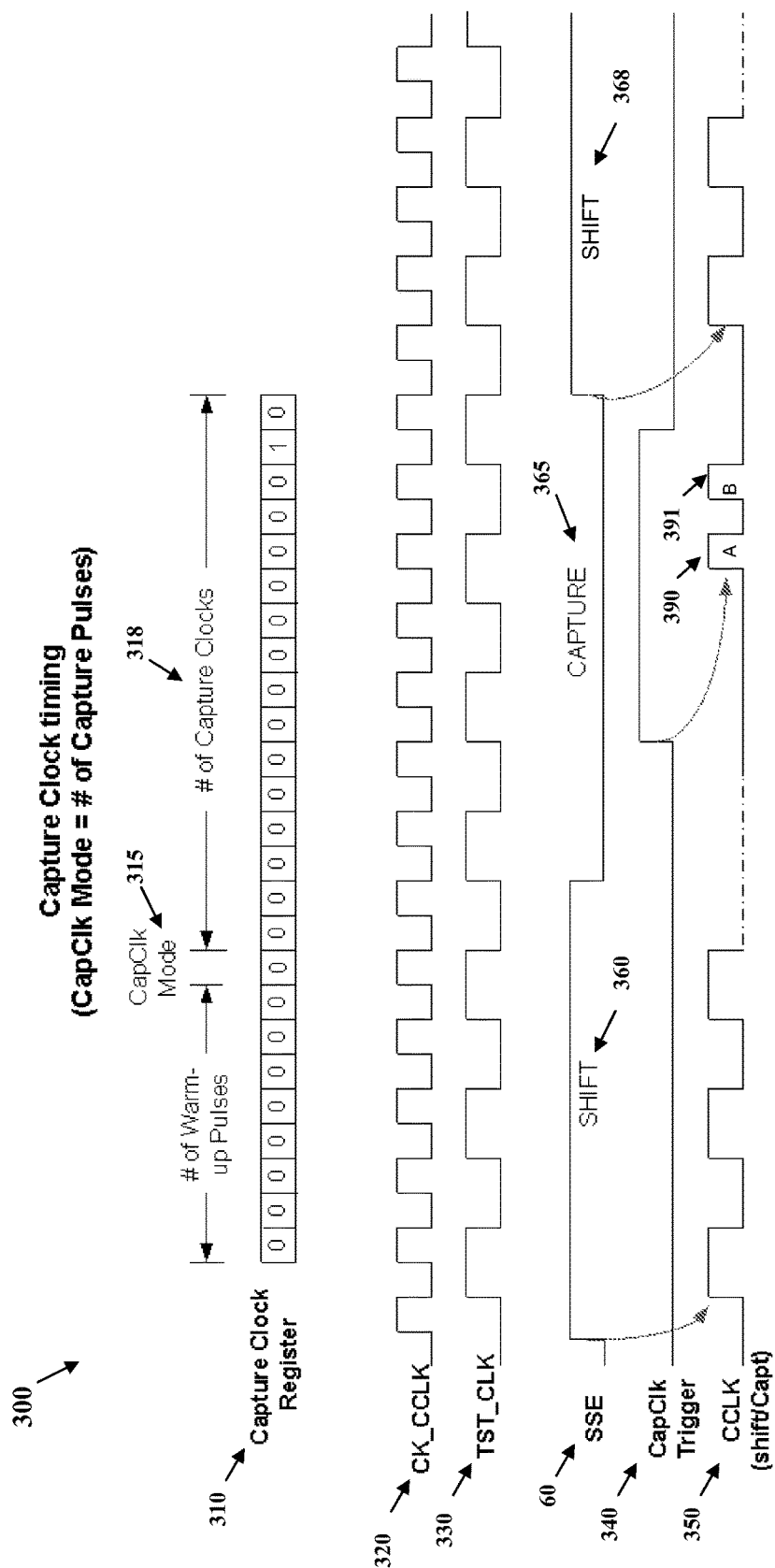
FIG. 3 is a timing diagram of an exemplary embodiment of the invention illustrating the generation of at-speed clock pulses within a capture cycle.

FIG. 3 illustrates an exemplary capture clock timing sequence 300 for conducting a scan test, the timing of which is shown by reference to SSE 60. Within a scan test cycle, a test pattern is shifted 360 into the scan chain 290 (FIG. 2) by CCLK 350, a capture cycle 365 is initiated by trigger signal 340 from test control 230 (FIG. 2), and the results are shifted out 368 under the control of CCLK 350. As indicated by the diagram, two at-speed clock pulses A 390 and B 391 appear on CCLK 350 during the capture cycle 365, as generated by clock control 240 using CK_CCLK 320 in relation to the rising edge of the trigger 340. The rest of the clock pulses comprising CCLK 350 are generated from test clock 330, which controls the shifting of the test patterns into and the test results out of the scan chain, respectively.

The contents of capture clock register 310 configure the operation of clock control 240. Capture clock register 310 can be either JTAG register 225 or scan test register 270. As shown, the register contains a mode bit 315 and information 318 determining the required number of at speed clocks to generate during the upcoming capture cycle. The mode bit 315 is used by clock control 240 to interpret the data 318 in the register. In one mode, the information 318 determines only the number of at-speed clocks to produce. In another mode, it may determine both the number and location of the clocks within the capture cycle.

In scan test operation, test control 230 first asserts control signals 238 to clock control 240 (FIG. 2) to select the test clock 330 for shifting a test pattern into the scan chain 290. The test clock 330 appears on CCLK 350, as shown in FIG. 3, which is provided to the scan chain 290 as CLK 70 (FIG. 2). Test control 230 manipulates SSE 60 to control the shifting in of the test pattern 360. Once the test pattern has been loaded, test control 230 enters a capture cycle 365 by deactivating SSE 60 and sourcing a trigger signal 340 to clock control 240. Clock control 240 receives the trigger signal 340 and, based on the information contained in the capture clock register 310, generates the required number of at-speed clock pulses (e.g., two, as shown by A 390 and B 391). Clock control 240 generates at-speed clock pulses by, for example, selecting system clock 320 using multiplexer 280 and gating the system clock using gate signal 248 and gate 285. Once the required number of at-speed clocks has been supplied to scan chain 290, clock control 240 returns a CMPLT 245 signal to test control 230 (FIG. 2). Test control 230 deactivates the trigger 340, resulting in clock control 240 selecting the test clock 330 through multiplexer 280, and sources SSE 60 to shift the test results out of the scan chain 290. In this operation, SSE 60 may be supplied to clock control 240 to gate the test clock using gate signal 248 and gate 285 for proper shifting of the test results.

Figure 4:
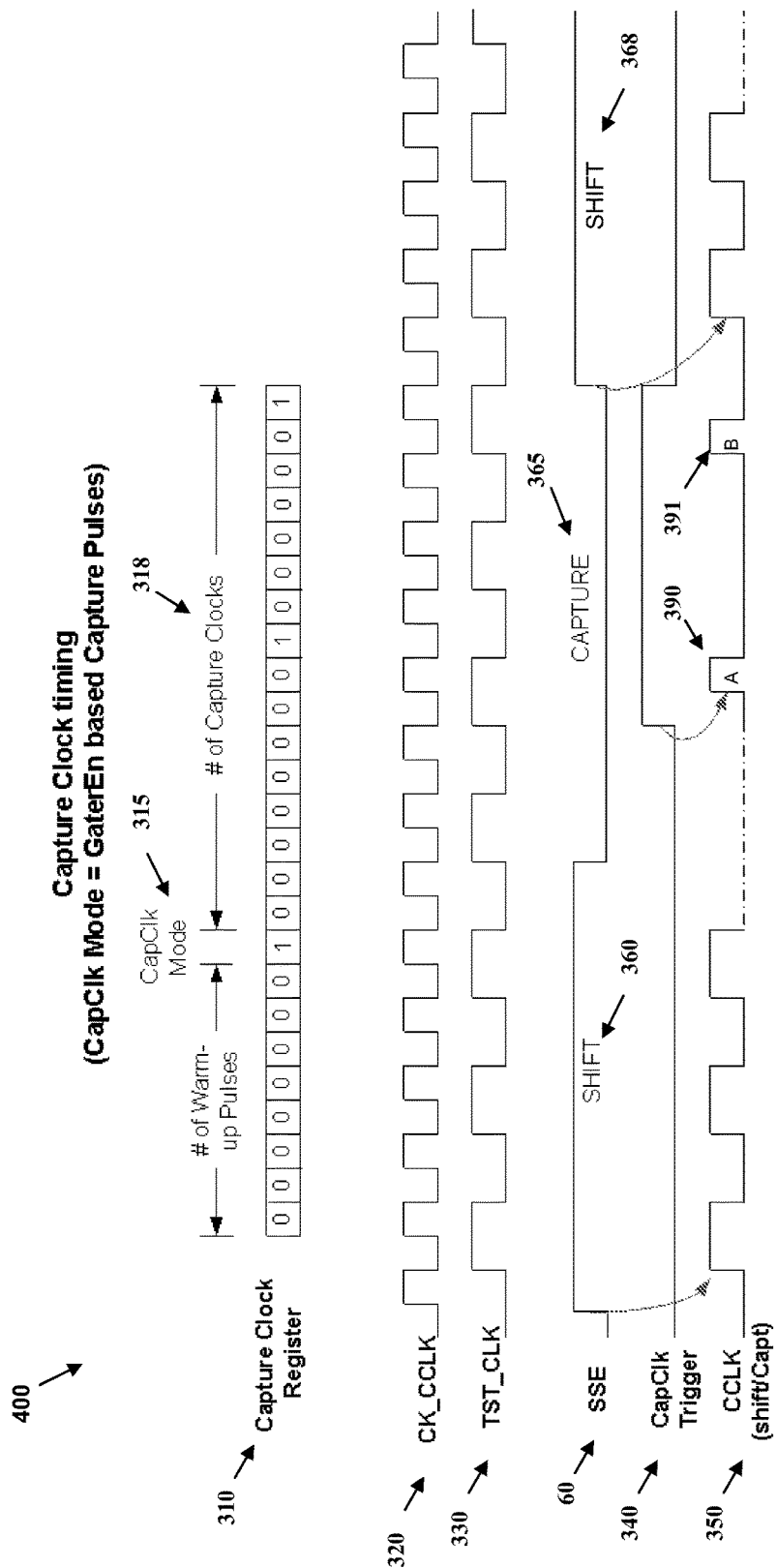
FIG. 4 is a timing diagram of an exemplary embodiment of the invention illustrating the generation of a delay between clock pulses in a capture cycle.

FIG. 4 is a timing diagram illustrating a further exemplary embodiment of the invention. The operation is identical to that described with reference to FIG. 3, except that mode bit 315 is set, indicating that the pulses that are generated during the capture cycle 365 and supplied to the scan chain 290 should be delayed relative to one another or be placed at specific locations within the capture cycle, as illustrated by 390 and 391. In one embodiment of the invention, clock control 240 can generate the pulses by loading the data contained in 318 into a shift register and shifting the bits out, generating a clock pulse for every bit that is set in the register 318. In this embodiment, the bits in the register determine the location of the clocks within the capture cycle. In another embodiment, the information contained in 318 can be a delay value that is loaded into a counter to set the delay between the clock pulses. The rising edge of the trigger may determine when the first clock pulse 390 is generated, as indicated in FIG. 4, and the delay mechanism determines the amount of delay between any other clock pulses that are required to be generated for the current capture cycle, based on the information contained in the register 310. Other clock control mechanisms can be used.

LBIST operation is similar to scan test operation. LBIST 260 typically relies on the JTAG register 225 for configuring clock control 240. In this embodiment, the JTAG register 225 is first loaded from the JTAG interface 220. LBIST is then initiated through the JTAG interface 220. Once LBIST generates the test pattern according, in one embodiment, to the means described above, it shifts the test pattern into the scan chain 290 in the manner described above for scan test and supplies trigger 340 to clock control 240. Once clock control 240 receives trigger 340, it generates the required number of at-speed clocks, with any appropriate delays, during the capture cycle 365 based on the information loaded into the JTAG register 225. Clock control 240 then sources the CMPLT signal 245 to LBIST 260, which then coordinates the shifting out of the test results through the JTAG interface 220 by means existing in the art. The invention disclosed herein allows conventional LBIST operation utilizing the clock control 240 mechanism described herein by the addition of the JTAG register 225.

The clock control circuit, the scan-test register, and the JTAG register described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant invention. As understood by one or ordinary skill in the art, it may be programmed into a computer, processor or controller, which may then control, in whole or part, the operation of a semiconductor manufacturing facility (or fab) to create semiconductor products and devices. These tools may be used to construct the embodiments of the invention described herein.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method of testing, comprising:
    forming a register on a semiconductor material, the register comprising a mode bit and control data input from a test interface;
    forming a capture clock generation circuit on the semiconductor material, the capture clock generation circuit coupled to the register; and
    responsive to a first mode as determined by the mode bit of the register, determining, based on the control data, both a number and location of clock pulses within a capture cycle of a scan test.

2. The method of claim 1, wherein the register is one of a scan register and a joint action test group (JTAG) register.

3. The method of claim 2, further comprising: forming a test control circuit that includes a logic built-in self-test (LBIST) logic block and a scan test logic block, each logic block configured to source a scan data signal and a scan enable signal.

4. The method of claim 3, further comprising:
    responsive to a second mode as determined by the mode bit of the register, determining, based on the control data, a number of at-speed clocks to generate during the capture cycle of the scan test.

5. The method of claim 4, further comprising:
    loading, by the test control circuit, a test pattern into a scan chain by activating a shift scan enable (SSE) signal of the test control circuit; and
    initiating the capture cycle by sourcing a trigger signal from the test control circuit to the capture clock generation circuit and deactivating the SSE signal.

6. The method of claim 4, wherein the scan register comprises one or more scan cells.

7. The method of claim 6, wherein the scan register is part of the scan chain.

8. The method of claim 7, further comprising:
    activating the LBIST logic block; and
    bypassing the scan register.

9. A semiconductor device, comprising:
    a register comprising a mode bit and control data input from a test interface;
    a clock control circuit coupled to the register that determines, based on the mode bit, whether the control data indicates one of a number of at-speed clocks to produce in a capture cycle and a number and location of clocks in a capture cycle; and
    a test control circuit that activates a trigger signal to initiate the capture cycle.

10. The semiconductor device of claim 9, wherein the test control circuit comprises a logic built-in self-test (LBIST) logic block and a scan test logic block.

11. The semiconductor device of claim 10, wherein the LBIST logic block comprises a random data generator.

12. The semiconductor device of claim 11, wherein the LBIST logic block and the scan test logic block are each configured to source a shift scan enable signal and a scan input signal.

13. The semiconductor device of claim 10, wherein the register is one of a scan register and a joint test action group (JTAG) register.

* * * * *